(12) United States Patent
Kano et al.

(10) Patent No.: US 6,384,383 B2
(45) Date of Patent: May 7, 2002

(54) CERAMIC HEATING JIG

(75) Inventors: Shoji Kano; Kenji Ito; Akira Sato, all of Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/728,082

(22) Filed: Dec. 4, 2000

(30) Foreign Application Priority Data

Dec. 9, 1999 (JP) .......................................... 11-349685

(51) Int. Cl.[7] .............................. H05B 3/68; H05B 3/10; C23C 16/00
(52) U.S. Cl. .................... 219/444.1; 219/548; 118/725
(58) Field of Search ........................... 219/443.1, 444.1, 219/542, 546, 547, 548; 118/724, 725, 727, 728, 729

(56) References Cited

U.S. PATENT DOCUMENTS

| | | | | |
|---|---|---|---|---|
| 5,063,031 A | * | 11/1991 | Sato ........................... | 118/725 |
| 5,344,492 A | * | 9/1994 | Sato et al. ................... | 118/725 |
| 5,382,311 A | * | 1/1995 | Ishikawa et al. ............. | 118/728 |
| 5,625,526 A | * | 4/1997 | Watanabe et al. ........... | 361/234 |
| 5,673,167 A | * | 9/1997 | Davenport et al. .......... | 361/234 |
| 5,851,298 A | * | 12/1998 | Ishii ............................ | 118/728 |

\* cited by examiner

*Primary Examiner*—Sang Paik
(74) *Attorney, Agent, or Firm*—Oliff & Berridge, PLC (57) ABSTRACT

There is disclosed a ceramic heating jig consisting of a susceptor 2 on which a work to be heated is placed, a ceramic heater 3 for heating the susceptor and at least one heat shielding plate 4 for shielding heat of the ceramic heater wherein the susceptor and the heat shielding plate are located so that each of them is located across the ceramic heater each leaving a certain space therefrom, a thickness of the susceptor is 0.5 m to 5 mm, a thickness of the ceramic heater is 0.5 mm to 3 mm, a thickness of the heat shielding plate is 0.5 mm to 3 mm. Preferably, an interval between the members is 0.5 mm to 10 mm, and the members are elastically held as an integration by the elastic means 6 and the restraint means 7. There can be provided a ceramic heating jig wherein defects such as thermal deformation, breakage or the like of the susceptor or the like are hardly caused, temperature can be raised or lowered rapidly, and flatness of a susceptor can be kept even at high temperature.

26 Claims, 3 Drawing Sheets

CERAMIC HEATING JIG

BACKGROUND OF THE INVENTION

1. Field of the Invention

The present invention relates to a ceramic heating jig, more specifically to a ceramic heating jig suitably used for a heat treatment process in a process for producing a semiconductor device or an optical device.

2. Description of the Related Art

As a general resistance heating heater used for a process for producing a semiconductor device or the like, there has been conventionally used a heater wherein a wire or a foil made of metal having high melting point such as molybdenum, tungsten (W) or the like is wound around or adhered on a base material made of sintered ceramics such as alumina, aluminum nitride, zirconia, boron nitride, or the like, on which a electrical insulating ceramic plate is placed. As improvement thereof, there have been developed a resistance heating ceramic heater wherein an exothermic layer made of conductive ceramics is provided on an electrical insulating ceramic base material, on which electrical insulating ceramic is coated, and a resistance heating ceramic heater wherein a conductive heating element such as W or the like is buried in electrical insulating ceramic, and is molded integrally. They are improved in insulating property and corrosion resistance.

As a ceramic base material, there is generally used a sintered body wherein a sintering additive is added to a raw material powder, which is then sintered. In such a ceramic base material, damage is caused by thermal stress generated due to a difference of thermal expansion coefficient from heterogeneous material such as a heating element. For example, when semiconductor wafer or the like is placed and heated on a ceramic heater base consisting of heterogeneous material such as a ceramic base material and a heating element, a failure of surface close contact with the wafer may be occurred due to the above-mentioned damage, which may cause disorder of temperature distribution.

As a method for suppressing such damage, there have been proposed, a method of increasing stiffness by increasing thickness of ceramic base material, and a method of reinforcing fixing with a table. However, if a damage is suppressed by methods described above, thermal stress may be concentrated inside of ceramic base material, and on an interface between a ceramic base material and a heating element. Accordingly, if temperature is increased and decreased repeatedly, problems such as breakage at sintered grain boundary or an interface between a ceramic base material and a heating element may be caused.

Furthermore, if thickness of a ceramic base material is increased, thermal capacity is increased, and thus there may be caused a problem that it takes long time to raise and lower a temperature.

In order to solve the problem, there have been developed a multi-layer resistance heating ceramic heater that is an integral type wherein a heater pattern consisting of pyrolytic graphite film formed by thermal chemical vapor deposition method (thermal CVD method) is joined on a surface of a supporting substrate consisting of pyrolytic boron nitride film formed by thermal CVD method, and the heater pattern is covered with a close layered protective film made of the same material as that of the supporting substrate, namely pyrolytic boron nitride.

The multi-layer resistance heating ceramic heater has a high purity and is chemically stable and strong to thermal shock. Accordingly, it has been used in various fields that requires rapid raising and lowering of temperature. For example, it has been used in a field of production of a semiconductor wafer. Specifically, it is used widely at a continuous process wherein a semiconductor wafer or the like is treated in a single wafer processing method, and temperature is changed in phase. Since the multi-layer ceramic heater is totally manufactured by a CVD method as described above, there is no grain boundary, and thus there is no de-gassing, so that there is no harmful influence to the process when heating is conducted in a vacuum process. Accordingly, it has been used in a wider field.

However, pyrolytic boron nitride constituting the above-mentioned multi-layer ceramic heater has a small Young's modulus, a warp is caused during heating due to thermal stress remaining in the substrate during production. If a wafer or the like is placed and heated directly thereon, failure of surface close contact may be caused, which may cause disorder in temperature distribution. Accordingly, it is necessary that susceptor made of material that has large Young's modulus and is excellent in heat resistance is located on the ceramic heater, and the wafer is placed thereon to be heated.

A susceptor has a thermal capacity corresponding to size, and a rate of raising and lowering temperature of a wafer in the case that a wafer is heated on the susceptor depends on thermal capacity of the susceptor. The rate of raising and lowering temperature can be increased by decreasing thermal capacity of a susceptor. In that case, it is necessary to decrease thermal capacity by decreasing thickness of the susceptor, since it is necessary to make an area of upper surface thereof the same or more as the wafer. If a thin susceptor is used, thermal capacity can be decreased, and a rate of raising and lowering temperature is raised. However, if it is too thin, there may be caused a warp during processing of the susceptor and thermal deformation during raising and lowering temperature, which may lead to disorder of temperature distribution due to failure of surface close contact with a wafer.

In the case that a susceptor is fixed to the ceramic heater or the like by fastening tightly with a screw or a bolt, stress generated around the fixed part when it is fasten, or thermal stress generated during heating may cause swell of the susceptor, which may lead to breakage thereof. As described above, deformation or breakage due to fixing with a screw or a bolt is not only a problem in the susceptor, but also a problem in a part that is especially heated, such as a ceramic heater, a heat shielding plate used for shielding heat of a ceramic heater or the like.

SUMMARY OF THE INVENTION

The present invention has been accomplished to solve the above-mentioned problems, and an object of the present invention is to provide a ceramic heating jig wherein defects such as thermal deformation, breakage or the like of susceptor or the like are hardly caused, temperature can be raised or lowered rapidly, and flatness of a susceptor can be kept even at high temperature.

To solve the above-mentioned problems, the present invention relates to a ceramic heating jig consisting of a susceptor on which a work to be heated is placed, a ceramic heater for heating the susceptor and at least one heat shielding plate for shielding heat of the ceramic heater wherein the susceptor and the heat shielding plate are located so that each of them is located across the ceramic heater each leaving a certain space therefrom, a thickness of the susceptor is 0.5 mm to 5 mm, a thickness of the ceramic heater is 0.5 mm to 3 mm, a thickness of the heat shielding plate is 0.5 mm to 3 mm.

As described above, in a ceramic heating jig wherein the susceptor having a certain thickness and at least one heat shielding plate are located so that each of them is located across the ceramic heater each leaving a certain space therefrom, a thickness of the susceptor and the ceramic heater is not too thin, so that strength is sufficient, swell or the like is never caused on the upper surface of the susceptor. They are not too thick either, so that they have small thermal capacity, and can raising and lowering a temperature rapidly.

In that case, it is further preferable that an interval between the susceptor and the ceramic heater, and an interval between the heat shielding plate and the ceramic heater are 0.5 mm to 10 mm.

If the susceptor, the ceramic heater and the heat shielding plate are located leaving such an interval, the intervals between them are not too narrow nor too wide, the heat of the ceramic heater can be conducted to the susceptor efficiently, and emission of the heat to the opposite side to the susceptor can be prevented efficiently.

According to the present invention, a ceramic heating jig consisting of a susceptor on which a work to be heated is placed, a ceramic heater for heating the susceptor and at least one heat shielding plate for shielding heat of the ceramic heater wherein spacers are provided respectively between the susceptor and the ceramic heater, between the heat shielding plate and the ceramic heater, and between the heat shielding plates when more than one heat shielding plates are provided, the susceptor, the ceramic heater and heat shielding plate are held to be integrated by being sandwiched between an elastic means having elasticity contacted with the lower surface of the heat shielding plate that is located at the lowest position and a restraint means contact with the upper surface of the susceptor on which the work is placed for prohibiting action in a vertical direction to the upper surface by the elastic means.

As described above, if spacers are provided between each of the susceptor, the ceramic heater and the heat shielding plate (hereinafter referred to as a heating member occasionally), and the heating members are supported to be integrated by being sandwiched between the elastic means having elasticity and the restraint means, thereby each of the heating members can be expanded without too much force to a direction of thickness and a direction of surface during heating. Accordingly, damage, swell or the like are not generated.

In that case, it is preferable that thickness of each of the heating members are in the above-mentioned range, namely 0.5 mm to 5 mm as for the susceptor, 0.5 mm to 3 mm as for the ceramic heater, 0.5 mm to 3 mm as for the heat shielding plate.

Furthermore, an interval between each of the heating members is also in the above-mentioned range, namely, the interval between the susceptor and the ceramic heater, and the interval between the heat shielding plate and the ceramic heater are 0.5 mm to 10 mm.

As described above, if the heating members having a certain thickness are located at a certain interval via a spacer, and the heating members are held to be integrated by being sandwiched between the elastic means and the restraint means, damage, swell or the like during heating can be efficiently prevented.

Furthermore, it is preferable that the above-mentioned elastic means and restraint means are fixed on the table, and the above-mentioned elastic means comprises spring. According to such a constitution, each of the heating members can be supported to be integrated more stably.

Preferably, a takeout terminal for supply of electricity is provided at the above-mentioned table of the ceramic heating jig of the present invention.

It is more preferable that a thermocouple for controlling temperature and/or for monitoring temperature is provided in the above-mentioned susceptor and/or ceramic heater.

According to such a constitution, electricity can be easily supplied to the ceramic heater and temperature of the susceptor can be accurately controlled.

Furthermore, air supply inlets and air exits are preferably provided in the table. In that case, it is more preferable that air supply inlets are provided at a center of the table, and more than one of the above-mentioned air exits are provided outside the air supply inlets at a peripheral part of the table.

If nitrogen or the like is supplied and exhausted through the above-mentioned air supply inlets and air exits, ventilation of a space in the heating jig between the table and the heat shielding plate can be conducted, and the difference in pressure of the space in the heating jig from a space outside such as a space in a processing room in which the heating jig is installed can be controlled. Furthermore, supplied gas is dispersed in the inner space in the heating jig and exhausted, so that a lowering rate of temperature (a cooling rate) of the heating jig can be improved, and uniform cooling can be achieved.

Then, the above-mentioned spacer is preferably more than one ceramic spacer in a shape of sphere or column.

Such a spacer can advantageously function especially when each of the heating members is expanded.

It is preferable that the above-mentioned restraint means also function as means for defining position of the work to be heated that is placed on the susceptor.

If the restraint means is made to be fit into the shape of the work to be heated, it can also function as a means for positioning the work to be heated, and it is not necessary to provide a positioning means on the susceptor separately, so that the constitution can be simple.

The above-mentioned ceramic heater preferably consists of a complex of a base material made of pyrolytic boron nitride and a heating element made of pyrolytic carbon. Difference in thermal expansion coefficient of each of pyrolytic boron nitride and pyrolytic carbon of the complex is preferably $2 \times 10^{-6}$ ° C. or less.

Such pyrolytic boron nitride and pyrolytic carbon of a complex can be suitably produced according to a thermal chemical vapor deposition method.

Such a complex ceramic heater has good adhesion property, and stress or warp is hardly caused therein.

The above-mentioned susceptor is preferably made of any of aluminum nitride, boron nitride, a complex of aluminum nitride and boron nitride, silicon nitride, silicon carbide, quartz, carbon coated with silicon carbide, carbon coated with pyrolytic boron nitride, or sialon. The heat shielding plate is preferably made of any of aluminum nitride, boron nitride, a complex of aluminum nitride and boron nitride, pyrolytic boron nitride, silicon nitride, silicon carbide, quartz, carbon coated with silicon carbide, carbon coated with pyrolytic boron nitride, carbon coated with pyrolytic carbon, sialon, W, Mo, Ta, inconel or stainless steel.

The above-mentioned restraint means is preferably made of any of aluminum nitride, boron nitride, a complex of aluminum nitride and boron nitride, pyrolytic boron nitride, silicon nitride, silicon carbide, quartz, carbon coated with silicon carbide, carbon coated with pyrolytic boron nitride, carbon coated with pyrolytic carbon or sialon.

The above-mentioned table is preferably made of any of boron nitride, a complex of aluminum nitride and boron nitride, pyrolytic boron nitride, silicon nitride, silicon carbide, quartz, carbon coated with silicon carbide, carbon coated with pyrolytic boron nitride, carbon coated with pyrolytic carbon, sialon, W, Mo, Ta, inconel or stainless steel.

The spring in the above-mentioned elastic means is preferably made of any of carbon fiber reinforced carbon, silicon nitride, W, Mo, Ta, inconel or stainless steel.

If each of the members of the ceramic heating jig of the present invention is made of the above-mentioned material excellent in heat resistance, sure heating treatment can be conducted stably even at high temperature.

As explained above, in the ceramic heating jig of the present invention, a susceptor and a ceramic heater having sufficient strength, not large thermal capacity and an adequate thickness, and a heat shielding plate having sufficient strength and a thickness excellent in heat shielding property are provided at a certain interval in this order. A work to be heated can be heated and cooled rapidly. Each of these heating members can be supported elastically, damage or the like is not occurred on the surface of the susceptor during heating. Accordingly, a semiconductor wafer or the like can be heated uniformly.

DESCRIPTION OF THE INVENTION AND EMBODIMENT

The present invention will be specifically described below referring to figures, but is not limited thereto.

Figure 1:
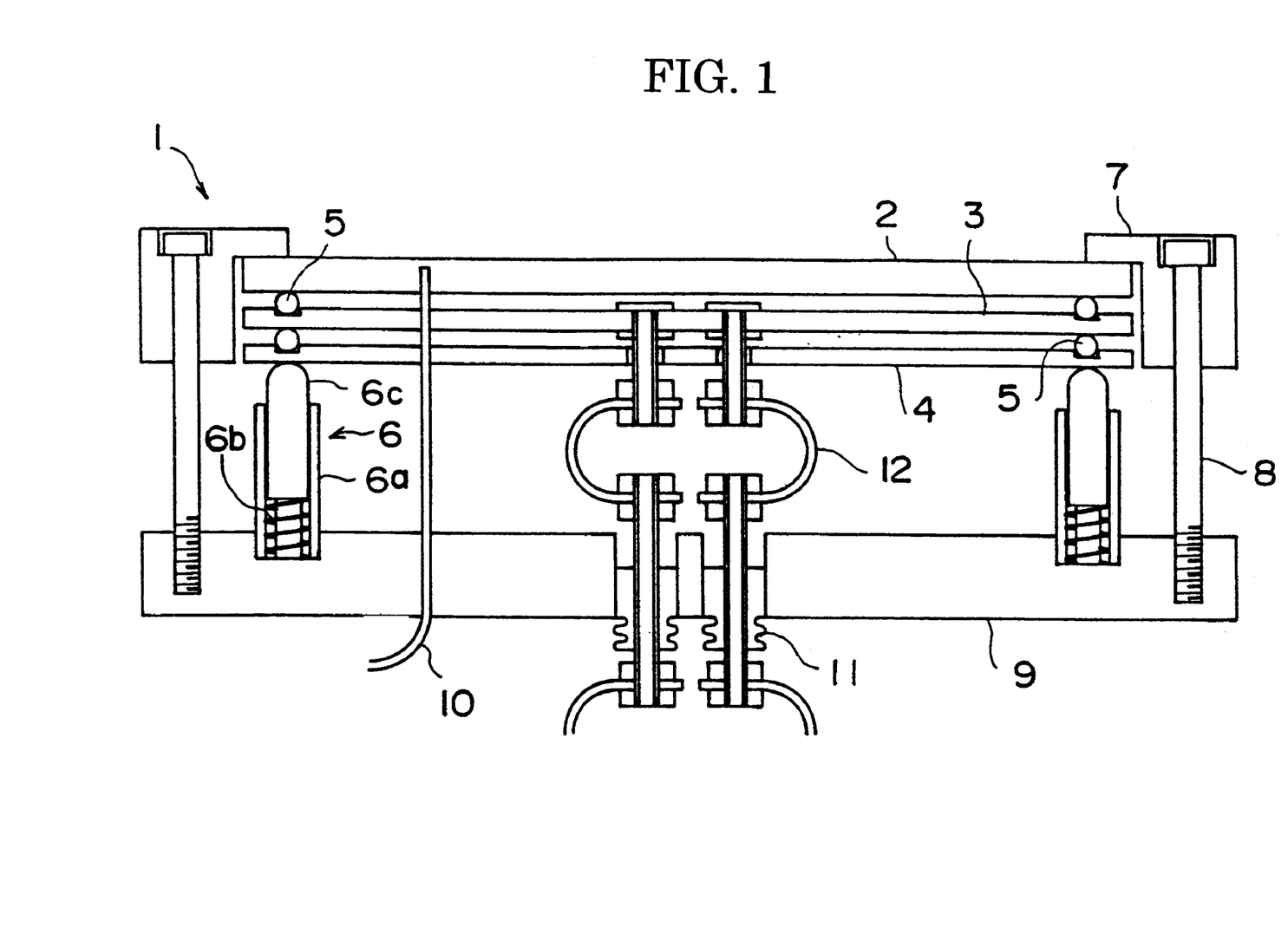
FIG. 1 is a local sectional schematic view of one example of the ceramic heating jig of the present invention.

FIG. 1 is a local sectional schematic view of one example of the ceramic heating jig of the present invention. The susceptor, the ceramic heater, and the heat shielding plate will be hereinafter referred to as heating members occasionally.

In the ceramic heating jig, there are located at certain interval a susceptor 2 on which a work to be heated such as a semiconductor wafer or the like is placed, a ceramic heater 3 and heat shielding plate 4 in this order via spherical spacers 5. Thickness of the susceptor 2 is 0.5 mm to 5 mm. Thickness of the ceramic heater 3 is 0.5 mm to 3 mm. Thickness of the heat shielding plate 4 is 0.5 to 3 mm.

If thickness of the susceptor 2 is less than 0.5 mm, although it depends on kinds of material, swell of the surface is apt to be large, strength, namely durability is insufficient, and production thereof is difficult. If the thickness is more than 5 mm, it is difficult to raise and lower a temperature rapidly. As for the ceramic heater 3, similar problems to those in susceptor 2 may be caused when the thickness is less than 0.5 mm, or more than 3 mm. If the thickness of the heat shielding plate 4 is less than 0.5 mm, there are caused a problem that swell of the plane surface is apt to be large, a problem that strength is insufficient, production thereof is difficult, and a problem that it cannot fulfill an original function sufficiently as a shield against heat of ceramic heater 3. If it is more than 3 mm, there are not caused the above-mentioned problems, but there is caused a problem that weight thereof is increased, resulting in bending due to its own weight, which may lead to bending of the susceptor 2. Accordingly, each of the heating members having the above-mentioned thickness are used.

More than one heat shielding plates can be provided in order to increase shielding effect of the heat shielding plate 4.

Spherical spacers 5 are provided between the susceptor 2 and the ceramic heater 3, and between the ceramic heater 3 and the heat shielding plate 4, and there are provided an interval of 0.5 mm to 10 mm between each of the heating members. Spot facing having the same size as the spherical spacer 5 is provided near a periphery part of the upper surface of heat shielding plate 4 and the ceramic heater 3. A part of the spherical spacer 5 is put in the spot facing in order not to roll.

Only one spherical spacer 5 each at the right and left on each of the ceramic heater 3 and the heat shielding plate 4 of the ceramic heating jig 1 is shown in FIG. 1. However, a lot of spherical spacers are actually located at equal intervals on each surface.

The shape of the spacer 5 is not limited. The shape other than the above-mentioned spherical shape is preferably columnar, and can be prismatic. The number of the spacers 5 depends on the shape of the spacer 5 or the shape of the heating members. However, in the light of stability, for example, it is preferably at least three when the heating members is in the shape of a disk, and is preferably at least 4 when the shape is square. However, if the spacer 5 is a ring having a size that enables the ring to be located near a periphery part of heating members, it can be located stably by locating only one between the heating members.

Thickness of each of the susceptor 2, the ceramic heater 3 and the heat shielding plate 4 and interval between them are as described above. Although it is described above that more than one heat shielding plates 4 can be provided, thickness of whole heating members is 10 cm or less, preferably 5 cm or less. Interval between the heating members is preferably equal. According to the above constitution of the ceramic heating jig 1, heat from the ceramic heater 3 can be conducted efficiently to the susceptor 2, and a shielding effect of the heat shielding plate 4 can be further improved.

An elastic means 6 comprising a spring 6b is brought into contact with a part near the periphery of the lower surface of the heat shielding plate 4 to push up the heating members as a whole. A restraint means 7 for controlling power pushed upward by elastic means 6 is brought into contact with the part near periphery of the upper surface of the susceptor 2 on which the work to be heated. The susceptor 2, the ceramic heater 3 and heat shielding plate 4 are supported to be integrated by being sandwiched between an elastic means and a restraint means.

In an embodiment shown in FIG. 1, the above elastic means 6 consists of a cylindrical member 6a fixed on the table 9, a spring 6b putting in the cylindrical member 6a and a supporting member 6c supported by the spring 6b and being in contact with the heat shielding plate 4. The lower small diameter part of the supporting member 6c is put in the inside of the spring 6b, and the upper part thereof having a curved surface projects from the cylindrical member 6a and is in contact with the heat shielding plate 4, and thereby the supporting member 6 elastically moves upward and downward depending on pressure from the heat shielding plate 4.

A part of the restraint means 7 is projected to a lateral direction and is in contact with the part near the periphery of the upper surface of the susceptor 2. The restraint means 7 is connected to the table 9 via bolts 8. Top of the bolt 8 functions as a stopper to restrain an upward motion thereof. A minus groove, a plus groove, hexagonal socket or the like is provided, if necessary, on the top surface of the bolt 8. Thereby, control of height restriction of restraint means 7 or desorption thereof from the table 9 can be conducted with an appropriate rotating means. Furthermore, for example, when the wafer is placed on the susceptor 2 and heated, the restraint means 7 also function as a means for positioning a semiconductor wafer.

The susceptor 2, the ceramic heater 3 and the heat shielding plate 3 are supported to be integrated by being held between the elastic means 6 and the restraint means 7 having the above-mentioned constitution. Namely, the heating members located at a certain interval via spacer(s) 5 as described above are raised by the elastic means 6, and a motion vertical to the upper surface of the susceptor 2 is restrained by the restraint means 7, and thereby the susceptor 2, the ceramic heater 3 and the heat shielding plate 4 are elastically supported as a whole between the elastic means 6 and the restraint means 7.

Accordingly, even if the susceptor 2, the ceramic heater 3 and the heat shielding plate 4 are expanded during heating, a force in direction of thickness can be easily absorbed by the elastic means 6. As for the expansion in a direction horizontal to the surface, since a front end part of the above-mentioned supporting member 6c has a curved surface, the front end part can slide on the lower surface of the heat shielding plate 4 that is in contact with it, and the restraint means 7 can slide on the upper surface of the susceptor 2 that is in contact with it, so that damage or the like is not caused. As shown in FIG. 1, space is provided between each of the side surface of the heating members and the restraint means 7 considering thermal expansion.

Neither the elastic means 6 nor the restraint means 7 is limited to the above-mentioned embodiments shown in FIG. 1. Any means that can elastically support the heating members as an integration can be used. For example, those having elastic property such as rubber, elastomer or the like can be used in stead of the spring 6b of the elastic means 6. The elastic means 6 does not always need to be located only near the peripheral edge surface of the heat shielding plate 4, but can also be located near the center of the heat shielding plate 4 so that it can be supported more stably. In the embodiment shown in FIG. 1, more than one elastic means 6 mentioned above are located. They are preferably located at an interval of 10 cm or less, more preferably 5 cm or less, and at an equal interval as far as possible.

The ceramic heating jig 1 shown in FIG. 1 comprise thermocouple 10 for controlling temperature of the susceptor 2 and/or for monitoring temperature. During heating, temperature of the susceptor 2 is controlled to be constant by monitoring temperature of the susceptor 2 and controlling power supply to the ceramic heater 3 depending on the temperature. Such a thermocouple 10 can be provided in the ceramic heater 3, or can be provided in both of them. Anyway, the thermocouple 10 is used so as to keep the temperature of the susceptor 2 constant.

Around the center part of the table 9 on which the elastic means 6 and the restraint means 7 are fixed respectively, a takeout terminal 11 for supplying power to the ceramic heater 3 is provided. The power supplied through the takeout terminal 11 is supplied to the ceramic heater 3 via heat resistant electric wire 12 provided between the table 9 and the heat shielding plate 4, to conduct heating. The position of the takeout terminal 11 is not limited, and can be provided at the periphery of the table.

The ceramic heater 3, the susceptor 2, the heat shielding plate 4 and the spacer 5 constituting the ceramic heating jig 1 of the present invention are exposed to high temperature especially, and therefore need to be made of the material having especially high heat resistance. Other members are also made of ceramics or metals having high heat resistance that is conventionally used. Especially preferable material will be explained below as for each of the members.

The ceramic heater 3 can be made of material that conventionally constitutes a ceramic heater 3, but is preferably consists of a complex of a base material made of pyrolytic boron nitride and a heating material made of pyrolytic carbon. It is especially preferable that difference in thermal expansion coefficient of pyrolytic boron nitride and pyrolytic carbon of the complex constituting the ceramic heater 3 is $2 \times 10^{-6}/°$ C. or less. Such pyrolytic boron nitride and pyrolytic carbon of the complex constituting the ceramic heater 3 can be appropriately produced by a thermal chemical vapor deposition method.

If the ceramic heater is made of such materials, excellent heat resistance or the like can be achieved, and warp, delamination or the like can be prevented.

As the susceptor 2, those made of any material selected from aluminum nitride, boron nitride, a complex of aluminum nitride and boron nitride, silicon nitride, silicon carbide, quartz, carbon coated with silicon carbide, carbon coated with pyrolytic boron nitride, or sialon can be used. All of these materials are hard, have excellent heat resistance and cause very little damage even if they are exposed to high temperature, so that they are suitable for the material of susceptor.

As the heat shielding plate 4, those made of any material selected from aluminum nitride, boron nitride, a complex of aluminum nitride and boron nitride, pyrolytic boron nitride, silicon nitride, silicon carbide, quartz, carbon coated with silicon carbide, carbon coated with pyrolytic boron nitride, carbon coated with pyrolytic carbon, sialon, W, Mo, Ta, inconel or stainless steel can be used. All of these materials are hard, have excellent heat resistance and cause very little damage even if they are exposed to high temperature. Besides, they have great heat shielding effect.

As the restraint means 7, those made of any material selected from aluminum nitride, boron nitride, a complex of aluminum nitride and boron nitride, pyrolytic boron nitride, silicon nitride, silicon carbide, quartz, carbon coated with silicon carbide, carbon coated with pyrolytic boron nitride, carbon coated with pyrolytic carbon or sialon can be used suitably.

As the table, those made of any material selected from boron nitride, a complex of aluminum nitride and boron nitride, pyrolytic boron nitride, silicon nitride, silicon carbide, quartz, carbon coated with silicon carbide, carbon coated with pyrolytic boron nitride, carbon coated with pyrolytic carbon, sialon, W, Mo, Ta, inconel or stainless steel can be used.

The spring 6b in the elastic means 6 is preferably made of carbon fiber reinforced carbon, silicon nitride, W, Mo, Ta, inconel or stainless steel can be used. These materials are excellent in heat resistance, and can function sufficiently as the spring 6b even at high temperature.

Members other than the above mentioned members of the ceramic heating jig of the present invention, for example, the cylindrical member 6a and the supporting member 6c are preferably made of the material that is excellent in heat resistance, and is never deformed even at high temperature. For example, they are preferably made of the materials exemplified for the heat shielding plate.

Figure 2:
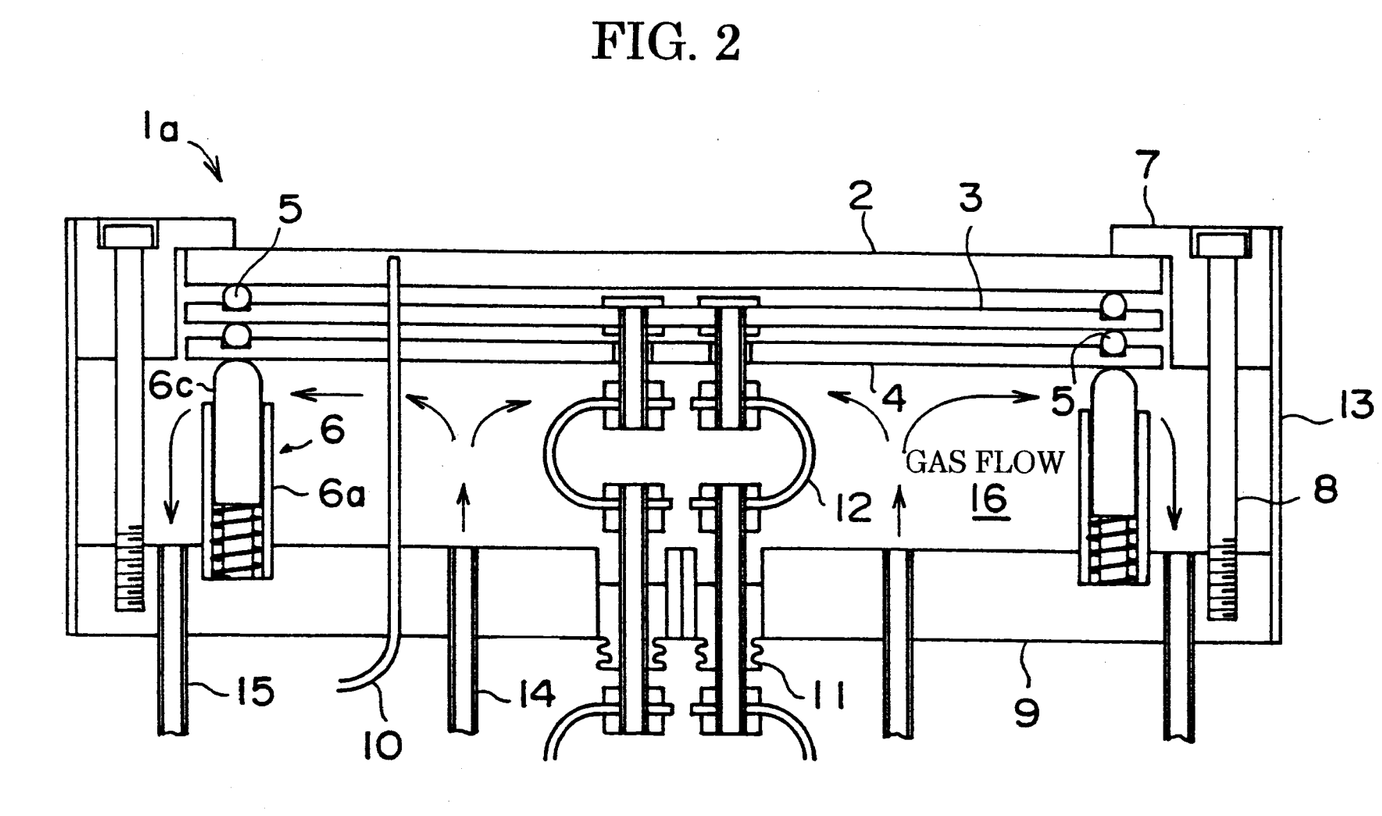
FIG. 2 is a local sectional schematic view of change embodiment of the ceramic heating jig shown in FIG. 1.

The ceramic heating jig 1a shown in FIG. 2 is a variation of the above-mentioned ceramic heating jig 1 shown in FIG. 1, in which a sealing cylinder 13 encircling the ceramic heating jig 1 shown in FIG. 1 is provided so that it may be in contact with the table 9 and the restraint means 7. Such a sealing cylinder 13 improves stability of the restraint means 7 in a lateral direction, and also has a heat shield effect, so that the susceptor 2 can be heated efficiently and the temperature thereof can be kept efficiently.

As a material for the sealing cylinder 13, the material having excellent heat resistance that is used for the above-mentioned members of the ceramic heating jig can be used. Especially, the same material as those used for the heat shielding plate 4 can be suitably used.

Air supply inlets 14 and air exits 15 can be provided in the table 9. The number and the position of the air supply inlets and the air exits to be provided are not limited. In the heating jig 1a shown in FIG. 2, more than one air supply inlets 14 are provided at a predetermined interval around the takeout terminal 11 for power supply so that they may surround it, and more than one air exit 15 are provided at a peripheral part of the table, outside the air supply inlets 14.

A gas such as nitrogen or the like is supplied and exhausted through air supply inlets 14 and air exits 15 provided described above in the table 9, so that ventilation in the inner space 16 of the heating jig between the table 9 and the heat shielding plate 4 can be conducted. Even if the inner space 16 of the heating jig is closed with the heat shielding plate 4, the table 9, and the sealing cylinder 13 or the like, difference in pressure between the inner space of the heating jig 16 and the outer space such as a processing room where the heating jig 1a is installed can be controlled by controlling amounts of supply gas and exhaust gas. Thereby, deformation such as damage and swell of the heating members during heating can be prevented effectively. Furthermore, since gas supplied from the air supply inlets 14 at the center of the table is flown radially as a whole to the plural air exits 15 provided at a certain interval at the peripheral part of the table, a rate of decreasing temperature (cooling rate) of the heating members can be improved, and a whole of the heating members can be cooled uniformly.

EXAMPLE

The following example and comparative example are being submitted to explain the present invention more specifically. These examples are not intended to limit the scope of the present invention.

(Example)

First, a substrate made of pyrolytic boron nitride having a thickness of 0.8 mm was produced by reacting $NH_3$ and $BCl_3$ at 100 Torr at 1900° C. Then, pyrolysis was conducted with varying a ratio of $CH_4$ and $BCl_3$ at 1500° C. and 50 Torr to form a pyrolytic graphite layer having a thickness of 100 $\mu$m where boron carbide was mixed in. Thereby, a pattern constituting a heater was processed. Subsequently, a protective layer of pyrolytic boron nitride having a thickness of 100 $\mu$m was formed by reacting $NH_3$ and $BCl_3$ at 100 Torr at 1900° C. Thereby, a multi-layer ceramic heater 3 having a diameter of 205 mm and a thickness of 1 mm was produced.

Using the ceramic heater 3 produced above, a ceramic heating jig having the above-mentioned constitution shown in FIG. 1 was produced. Specifically, the elastic means 6 having the spring 6b made of stainless steal (SUS304) was fixed at 12 positions with equal interval on the circle having a diameter of 190 mm on the table made of stainless steal (SUS316L), and thereon the heat shielding plate 4 made of pyrolytic carbon having a diameter of 205 mm and a thickness of 1 mm, the multi-layer ceramic heater 3 produced as above having a diameter of 205 mm and a thickness of 1 mm, and susceptor 2 made of aluminum nitride having a diameter of 205 mm and a thickness of 2 mm were located in this order. A certain interval via spherical spacers 5 made of alumina having a diameter of 2 mm is provided between the susceptor 2 and the ceramic heater 3 and between ceramic heater 3 and heat shielding plate 4. On the upper surface of the heat shielding plate 4 and the ceramic heater 3, spot facings were provided to prevent spherical spacers 5 from rolling. The spherical spacers 5 were placed in the spot facings.

The flatness of the susceptor 2 was 0.2 mm as measured in a free state.

The restraint means 7 made of quarts in the shape of a ring having an outer diameter of 240 mm, an inner diameter of 202 mm and a thickness of 20 mm was placed at a peripheral part of the susceptor 2 so that a part thereof was placed thereon, and fixed on the table 9 with bolts 8. The contracted spring 6b of the elastic means 6 pressed the heat shielding plate 4 upward and the restraint means 7 inhibited the power of the spring pressing it upward through the susceptor 2, and thereby the heating members were supported to be integrated by being sandwiched between them. The flatness of the susceptor 2 was decreased to 0.05 mm as measured at that time. Accordingly, it is clear that flatness was corrected.

The thermocouple 10 was fixed on the susceptor 2. A takeout terminal (power supply feed through) 11 for power supply through the table 9 was provided, to which heat resistance line 12 from the heater 3 was connected.

The ceramic heating jig 1 assembled as above was subjected to 100 times of heat cycle tests by repeating raising and lowering of temperature from 200° C. to 600° C. with monitoring temperature of the susceptor 2 with the thermocouple 10. There was observed no defects such as warp, breakage or the like in the ceramic heating jig. The rate of raising temperature in the test was 20° C./sec on the average. The rate of lowering temperature was 0.5° C./sec on the average. Flatness during heating was 0.06 mm at 600° C., which was almost the same as the flatness when the jig was assembled, namely at normal temperature, and no damage or the like was observed.

(Comparative Example)

Figure 3:
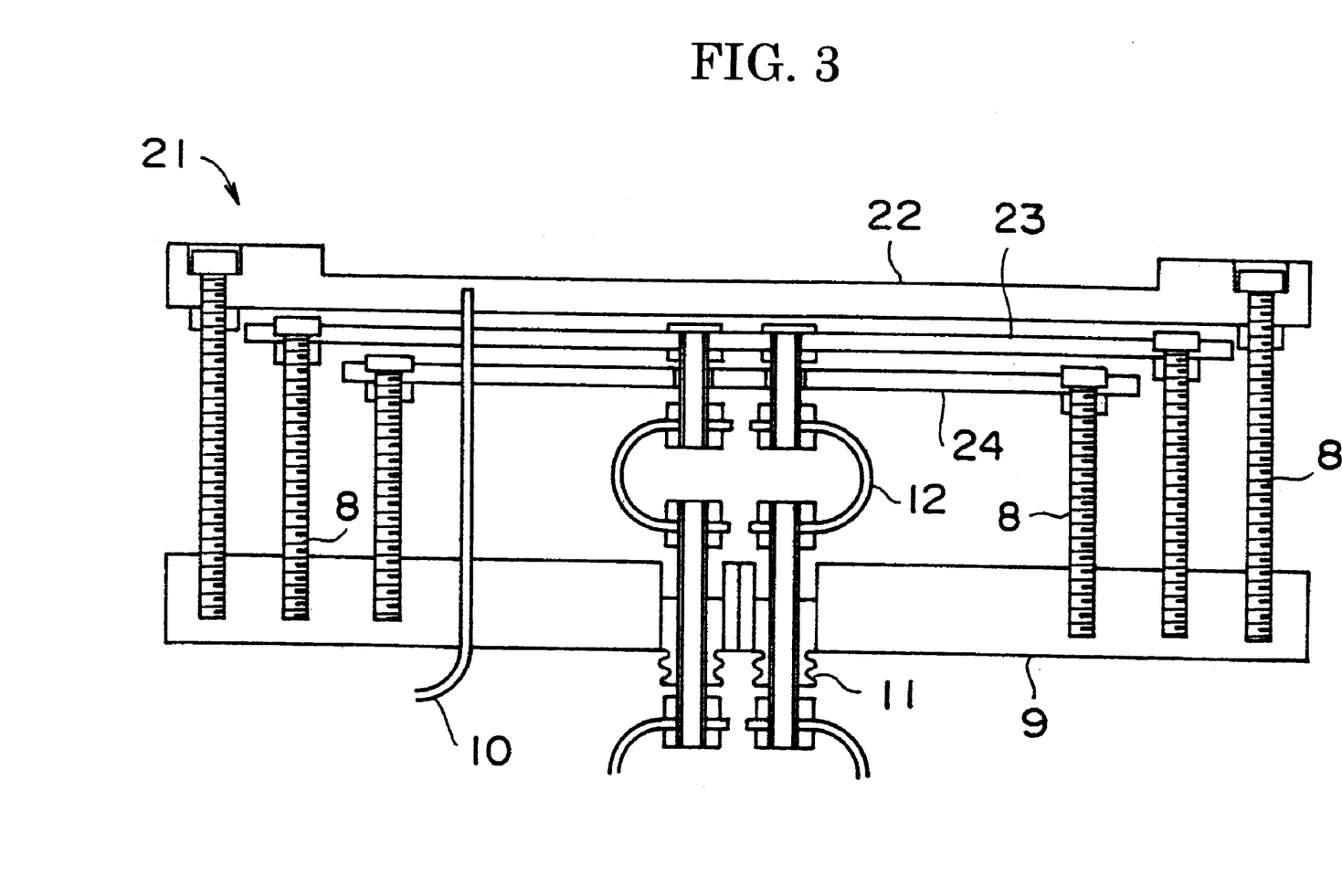
FIG. 3 is a local sectional schematic view of the ceramic heating jig assembled in Comparative Example.

A heat shielding plate 24 made of pyrolytic carbon having a thickness of 4 mm, the multi-layer ceramic heater 23 having a diameter of 205 mm and a thickness of 4 mm, and a susceptor 22 having a thickness of 7 mm were located in this order as shown in FIG. 3. All of the heating means were fixed on the table 9 with bolts 8. By the similar way to the ceramic heating jig 1 produced in Example, thermocouple 10 was fixed on the susceptor 22. Furthermore, a power supply feed through 11 was also provided.

The ceramic heating jig 21 assembled as above was subjected to the heat cycle tests similar to Example described above. Cracks were generated in the susceptor 22 at a position fixed with the bolt, resulting in breakage thereof, at only 5th cycle.

The present invention is not limited to the above-described embodiment. The above-described embodiment is a mere example, and those having the substantially same structure as that described in the appended claims and providing the similar action and effects are included in the scope of the present invention.

For example, in the above embodiments, the heating jig having one heat shielding plate was explained. However, a ceramic heating jig may have more than one heat shielding plates. The ceramic heating jig of the present invention is used not only for heating of a semiconductor wafer, but used widely, for example, for heat treatment in a process for production of a semiconductor device, an optical device or the like.

In the above-mentioned embodiments, it was explained that the restraint means 7 may function as a means for positioning the work to be heated. However, other positioning means corresponding to the shape of the work to be heated can be separately provided on the susceptor 2.

In any of the above-mentioned embodiments, in the ceramic heating jig of the present invention, damage or the like was not occurred, and flatness can be kept even at high temperature. Accordingly, if it is used for heat treatment of the work such as the semiconductor wafer or the like, there is caused no unevenness in temperature distribution, the heat treatment can be suitably conducted.

What is claimed is:

1. A ceramic heating jig consisting of a susceptor on which a work to be heated is placed, a ceramic heater for heating the susceptor and at least one heat shielding plate for shielding heat of the ceramic heater wherein the susceptor and the heat shielding plate are located so that each of them is located across the ceramic heater each leaving a certain space therefrom, a thickness of the susceptor is 0.5 mm to 5 mm, a thickness of the ceramic heater is 0.5 mm to 3 mm, a thickness of the heat shielding plate is 0.5 mm to 3 mm.

2. The ceramic heating jig according to claim 1 wherein an interval between the susceptor and the ceramic heater, and an interval between the heat shielding plate and the ceramic heater are 0.5 mm to 10 mm.

3. A ceramic heating jig consisting of a susceptor on which a work to be heated is placed, a ceramic heater for heating the susceptor and at least one heat shielding plate for shielding heat of the ceramic heater wherein spacers are provided respectively between the susceptor and the ceramic heater, between the heat shielding plate and the ceramic heater, and between the heat shielding plates when more than one heat shielding plates are provided, the susceptor, the ceramic heater and heat shielding plate are held to be integrated by being sandwiched between an elastic means having elasticity contacted with the lower surface of the heat shielding plate that is located at the lowest position and a restraint means contacted with the upper surface of the susceptor on which the work is placed for prohibiting action to a direction vertical to the upper surface by the elastic means.

4. The ceramic heating jig according to claim 3 wherein a thickness of the susceptor is 0.5 mm to 5 mm, a thickness of the ceramic heater is 0.5 mm to 3 mm, and a thickness of the heat shielding plate is 0.5 mm to 3 mm.

5. The ceramic heating jig according to claim 3 or 4 wherein an interval between the susceptor and the ceramic heater, and an interval between the heat shielding plate and the ceramic heater are 0.5 mm to 10 mm.

6. The ceramic heating jig according to claim 3 or 4 wherein the elastic means and the restraint means are fixed on a table.

7. The ceramic heating jig according to claim 3 or 4 wherein the elastic means comprises a spring.

8. The ceramic heating jig according to claim 6 wherein a takeout terminal for supply of electricity is provided at the table.

9. The ceramic heating jig according to claim 7 wherein a takeout terminal for supply of electricity is provided at a table.

10. The ceramic heating jig according to any one of claims 1 to 4 wherein a thermocouple for controlling temperature and/or for monitoring temperature is provided in the susceptor and/or the ceramic heater.

11. The ceramic heating jig according to claim 6 wherein air supply inlets and air exits are provided in the table.

12. The ceramic heating jig according to claim 7 wherein air supply inlets and air exits are provided in the table.

13. The ceramic heating jig according to claim 11 wherein the air supply inlets are provided at a center of the table, and more than one of the air exits are provided outside the air supply inlets at a peripheral part of the table.

14. The ceramic heating jig according to claim 12 wherein the air supply inlets are provided at a center of the table, and more than one of the air exits are provided outside the air supply inlets at a peripheral part of the table.

15. The ceramic heating jig according to claim 3 or 4 wherein the spacer is more than one ceramics spacers in a shape of sphere or column.

16. The ceramic heating jig according to claim 3 or 4 wherein the restraint means also function as means for defining position of the work to be heated that is placed on the susceptor.

17. The ceramic heating jig according to any one of claims 1 to 4 wherein the ceramic heater consists of a complex of a base material made of pyrolytic boron nitride and a heating element made of pyrolytic carbon.

18. The ceramic heating jig according to claim 17 wherein a difference between each thermal expansion coefficient of pyrolytic boron nitride and pyrolytic carbon of the complex is $2 \times 10^{-6}$ ° C. or less.

19. The ceramic heating jig according to claim 17 wherein the pyrolytic boron nitride and pyrolytic carbon of a complex is produced according to a thermal chemical vapor deposition method.

20. The ceramic heating jig according to claim 18 wherein the pyrolytic boron nitride and pyrolytic carbon of a complex is produced according to a thermal chemical vapor deposition method.

21. The ceramic heating jig according to any one of claims 1 to 4 wherein the susceptor is made of any of aluminum nitride, boron nitride, a complex of aluminum nitride and boron nitride, silicon nitride, silicon carbide, quartz, carbon coated with silicon carbide, carbon coated with pyrolytic boron nitride, or sialon.

22. The ceramic heating jig according to any one of claims 1 to 4 wherein the heat shielding plate is made of any of aluminum nitride, boron nitride, a complex of aluminum nitride and boron nitride, pyrolytic boron nitride, silicon nitride, silicon carbide, quartz, carbon coated with silicon carbide, carbon coated with pyrolytic boron nitride, carbon coated with pyrolytic carbon, sialon, W, Mo, Ta, inconel or stainless steel.

23. The ceramic heating jig according to claim 3 or 4 wherein the restraint means is made of any of aluminum nitride, boron nitride, a complex of aluminum nitride and boron nitride, pyrolytic boron nitride, silicon nitride, silicon carbide, quartz, carbon coated with silicon carbide, carbon coated with pyrolytic boron nitride, carbon coated with pyrolytic carbon or sialon.

24. The ceramic heating jig according to claim 6 wherein the table is made of any of boron nitride, a complex of aluminum nitride and boron nitride, pyrolytic boron nitride, silicon nitride, silicon carbide, quartz, carbon coated with silicon carbide, carbon coated with pyrolytic boron nitride, carbon coated with pyrolytic carbon, sialon, W, Mo, Ta, inconel or stainless steel.

25. The ceramic heating jig according to claim 7 wherein the table is made of any of boron nitride, a complex of aluminum nitride and boron nitride, pyrolytic boron nitride, silicon nitride, silicon carbide, quartz, carbon coated with silicon carbide, carbon coated with pyrolytic boron nitride, carbon coated with pyrolytic carbon, sialon, W, Mo, Ta, inconel or stainless steel.

26. The ceramic heating jig according to claim 7 wherein the spring in the elastic means is made of any of carbon fiber reinforced carbon, silicon nitride, W, Mo, Ta, inconel or stainless steel.

* * * * *